United States Patent [19]

Yamaguchi et al.

[11] Patent Number: 4,931,760
[45] Date of Patent: Jun. 5, 1990

[54] UNIFORM MAGNETIC FIELD GENERATOR

[75] Inventors: Junji Yamaguchi, Shimoogino; Terumasa Yamasaki, Samejima, both of Japan

[73] Assignee: Asahi Kasei Kogyo Kabushiki Kaisha, Osaka, Japan

[21] Appl. No.: 95,988

[22] Filed: Sep. 14, 1987

[30] Foreign Application Priority Data

Oct. 8, 1986 [JP] Japan .................. 61-238136

[51] Int. Cl.$^5$ .............................. H01F 7/02
[52] U.S. Cl. ................... 335/306; 335/299; 324/319
[58] Field of Search ............ 335/306, 299, 296; 324/319, 320

[56] References Cited

U.S. PATENT DOCUMENTS

| | | | |
|---|---|---|---|
| 4,422,042 | 12/1983 | Sugimoto | 324/319 |
| 4,429,277 | 1/1984 | Sugimoto | 324/319 |
| 4,639,673 | 1/1987 | Zijlstra | 324/319 |
| 4,672,346 | 6/1987 | Miyamoto et al. | 335/296 |
| 4,673,882 | 6/1987 | Buford | 324/320 |
| 4,695,802 | 9/1987 | Zijlstra | 324/319 |
| 4,707,663 | 11/1987 | Minkoff et al. | 324/319 |

FOREIGN PATENT DOCUMENTS 60-88407 5/1985 Japan .
61-88210 6/1986 Japan .

OTHER PUBLICATIONS

PCT Publication WO 84/00611 International App. No.: PCT/US83/01175 filed: Aug. 2, 1983 William Oldendorf inventor.

Primary Examiner—H. Broome
Attorney, Agent, or Firm—Sughrue, Mion, Zinn, Macpeak & Seas

[57] ABSTRACT

Magnetic field generators used in magnetic resonance imaging instruments (MRI) need an extremely uniform and wide magnetic field space. With the annulus of a field-generating annular magnet composed of a plurality of permanent magnet blocks arranged annularly, non-magnetic hold plates may be arranged in correspondence with each of the permanent magnet blocks, and field-regulating permanent magnet pieces may be fixed at stated positions of the hold plated, thereby obtaining a uniform magnetic field space.

17 Claims, 13 Drawing Sheets

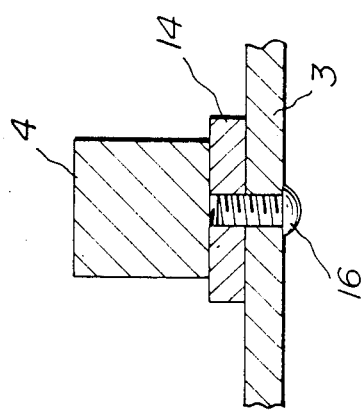
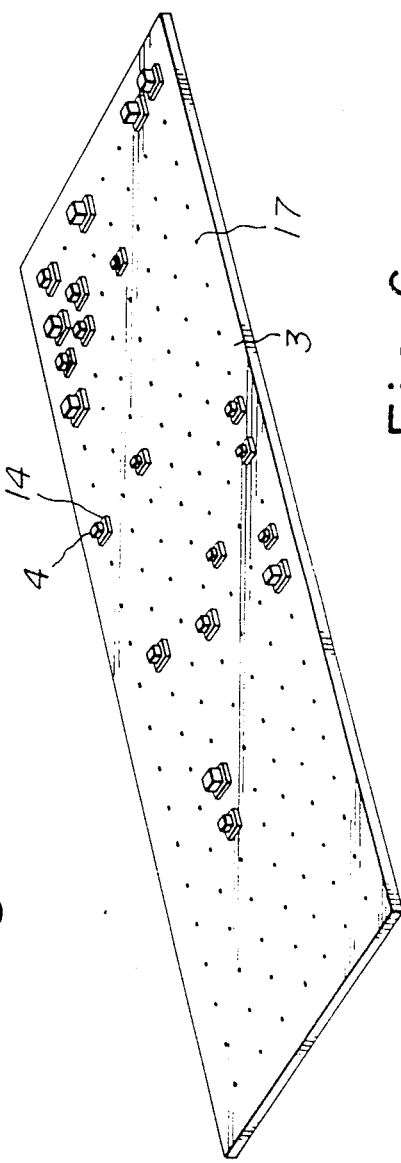

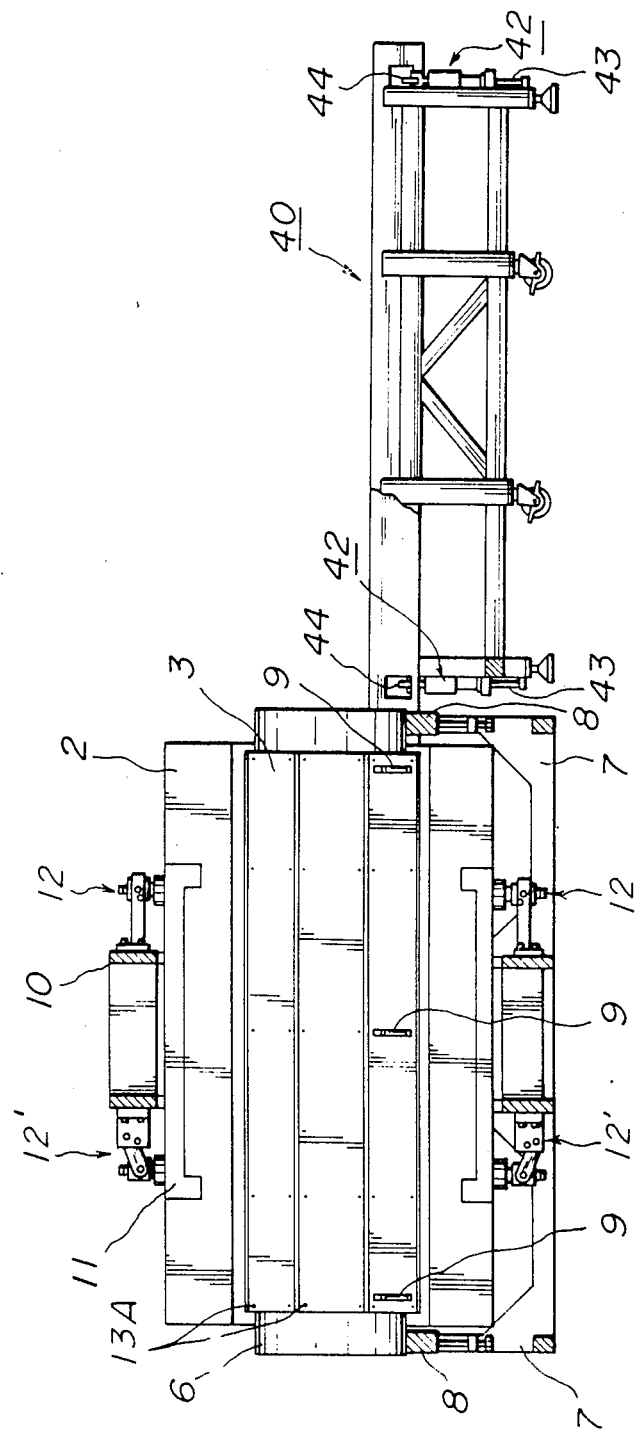

UNIFORM MAGNETIC FIELD GENERATOR

BACKGROUND OF THE INVENTION

FIELD OF THE INVENTION

The present invention relates to a magnetic field generator, and more particularly to a highly uniform magnetic field generator used in magnetic resonance imaging instruments (MRI).

DESCRIPTION OF THE PRIOR ART

The magnets used to generate magnetic fields can be grouped into following two types, electromagnet and permanent magnet. An electromagnet utilizes a magnetic field generated by an electric current flowing through a coil. In a resistive electromagnet the coil is made of copper or aluminum while in a superconducting magnet the coil is made of superconducting materials such as Nb-Ti, Nb₃Sn or the like, and the coil is cooled by liquid helium.

Three kinds of magnetic field generators are used in MRI, the resistive magnet type, superconducting magnet type, and permanent magnet type. The resistive magnet type utilizes an air-core coil or an iron-core coil. The initial cost of this type is low, but cooling instruments for keeping the coil cool are necessary.

The superconducting magnet type employs a superconducting coil and a cryostat which keeps the superconducting coil at a very low temperature (i.e., the temperature of liquid helium). This magnet type is high priced and maintenance is troublesome because of the use of liquid helium. However, by using this type of magnet, a stable, very high magnetic field such as 0.5–2 tesla can be obtained. As a result, a high signal to noise ratio can be obtained. Furthermore, at a magnetic field higher than 1 tesla, it becomes possible to measure the spectra of not only $^1$H but also $^{31}$P, $^{23}$Na and so on, and therefore more information from within a living body can be obtained.

The permanent magnet type has a permanent magnet for generating a magnetic field and a supporter for supporting the permanent magnet. Furthermore, a magnetic pole piece for maintaining the uniformity of the magnetic field and a magnetic yoke for forming a magnetic circuit may be provided. This permanent magnet type has a number of advantages, which include no need for field-generating power, low cost of maintenance, little field leakage, and small installation space.

A variety of proposals have been made to obtain a uniform magnetic field space by use of a permanent magnet. For example, the specifications of U.S. Pat. Nos. 4,498,048 and 4,580,098 show a magnetic field generator consisting of a plurality of rings, wherein a plurality of anisotropic permanent magnets are arranged annularly. This ring type magnetic field generator has the great advantage that it does not need a magnetic yoke, causing the total weight to be correspondingly lighter.

Magnetic field generators used in MRI are required to offer an extremely uniform and wide magnetic field space. With a central field of 1,000 gausses, for example, the required uniformity within a uniform field space is 100 ppm or less, and with 3,000 gausses, 30 ppm or less. However, in general, a magnetic field generating apparatus does not provide a sufficient field uniformity without field regulation after assembling the apparatus. Several factors are considered responsible for the non-uniformity of the generated field, including the working precision of parts and the assembly precision of apparatus. Especially, in the permanent magnet type magnetic field generator, the non-uniformity of magnetic characteristics found in used permanent magnet blocks is a dominant factor.

Of particular note, the aforesaid ring type magnetic field generator, despite the advantage of not requiring the use of a pole piece, has the problem that when compared with the yoke type, the effect of variation in the magnetic characteristics of permanent magnet blocks is reflected directly on the non-uniformity of field. That is, since small magnet bricks are built into these permanent magnet blocks, it is unavoidable with the present fabrication technique of magnet bricks that Br (residual magnetization) should vary considerably from one magnet brick to another, and that the magnetizing direction should vary with the grinding and bonding processes used in the fabrication of magnet bricks. Therefore, Br and the magnetizing direction inevitably become different within and between permanent magnet blocks, thus easily causing the uniformity of field to be insufficient for use in MRI.

For these reasons, it becomes necessary to provide magnetic field generators with a technique of regulation for improving the uniformity of field. For example, field regulation is carried out as follows. First, the field is measured at numerous points on the surface of a required field space (a sphere, for example), the non-uniformity of that field is approximated to a harmonic function, and is then expressed as the assembly of a number of harmonics. The uniformity of field is improved by diminishing these harmonics by means of regulation.

Regulation is performed by mechanically moving the coil or permanent magnet blocks which generate the main magnetic field, or magnetic parts such as magnetic yoke.

For a magnetic field generator composed of annular or ring-shaped magnets wherein a plurality of anisotropic permanent magnet blocks are arranged annularly, two techniques of field regulation are described also in the aforementioned specifications of U.S. Pat. Nos. 4,498,048 and 4,580,098. That is, both a structure for moving the rings along on an axial center line, and a structure for moving the permanent magnet blocks which constitute the rings, diametrically relative to the rings is provided.

According to the present inventors' study results when these means were used, however, the improvement of field uniformity was found inadequate. The reason probably is that these means alone, though capable of reducing relatively mild low-dimensional harmonics to a certain extent, are not effective in sufficiently reducing such high-dimensional harmonics which arise from, for example, the variation of magnetic characteristics in the individual magnet bricks which constitute permanent magnet blocks.

In addition, the specification of PCT/US83/01175 (International Publication No. WO84/00611) shows a yoke type magnetic field generator that uses permanent magnets, and describes a scheme of field regulation using numerous moving magnetic material screws provided on a pole piece.

This technique of field regulation employing moving magnetic material screws is interesting in that it can reduce high-dimensional harmonics. However, using this means of field regulation by moving magnetic material screws in the aforesaid ring type magnetic field generators involves two problems:

(1) When the size of magnetic material screws is small enough compared with the required size of a uniform field space, it is possible to produce high-dimensional harmonics, but means for moving small-sized magnetic material screws can only correct slight non-uniformities, therefore they are inadequate to improve the uniformity of ring type field generators which may generate a large amount of high-dimensional harmonics.

(2) Generally, materials like iron with high-permeability are used for magnetic material screws, but calculating the field generated by a system containing materials such as iron whose magnetic susceptibility varies markedly with the surrounding field entails the use of repeated correction methods such as the finite element method. Calculation in three-dimensional spaces therefore requires a vast amount of time, and it is difficult to optimize the location of magnetic material screws by calculation. In practice, therefore, optimization is reached through repetition of trial and error while moving the location of magnetic material screws. In such a method, however, regulation is a time-consuming process and, moreover, it is hard to improve uniformity satisfactorily.

Alternatively, another possibility is the use of a shim coil (ordinary conducting coil for field regulation). Conventionally, ten or more kinds of shim coils have been installed, but even that is not satisfactory in sufficiently reducing high-dimensional harmonics. However, installing different kinds of shim coils is undesirable for a number of reasons, such as higher apparatus cost, power consumption problems, and narrower internal space.

SUMMARY OF THE INVENTION

As mentioned previously, magnetic field generators used in MRI are required an extremely uniform and wide magnetic field space, but it is difficult to obtain a sufficient field uniformity with conventional magnetic field generators, especially using permanent magnets.

Therefore, the object of the present invention is to offer a magnetic field generator with means of field regulation which can sufficiently reduce not only low-dimensional harmonics but also high-dimensional harmonics, and which are so arranged as to permit easy regulation in a short time.

In the first aspect of the present invention a uniform magnetic field generator comprises:
 means for generating static magnetic field;
 at least one permanent magnet piece for regulating the uniformity of the static magnetic field; and
 means for holding the permanent magnet piece or pieces.

There are multiple permanent magnet pieces and the residual magnetization of each of the permanent magnet pieces is substantially identical to each other.

The permanent magnet pieces do not have to be uniform in size. The size of each of the permanent magnet pieces may be substantially identical to each other. The permanent magnet pieces do not have to be uniform in residual magnetization, and they can be fitted to and removed from the means for holding the permanent magnet pieces.

The means for generating static magnetic field may be a permanent magnet and may include a magnetic yoke. The means for generating static magnetic field may be an electromagnet and may be a superconducting magnet. The permanent magnet may be an annular magnet composed of permanent magnet blocks arranged annularly.

The permanent magnet blocks may be continuous bodies and may have at least three different sectional areas in a section vertical to the axial direction of the annulus within the same block. The plurality of permanent magnet blocks may be of face-symmetrical shape.

The section of the permanent magnet blocks cut vertical to the axis of the annular magnet may be greater at the two end portions, right and left, than at the center main portion, and between the center main portion and the two end potions, the block may have narrow portions with a smaller sectional area than that of the center main portion and the two end portions.

Each of the permanent magnet blocks may be movable in two axial directions squarely crossing the axial direction of the annular magnet, and the permanent magnet blocks may be rotatable around the two axial directions.

In the second aspect of the present invention, a uniform magnetic field generator comprises:
 means for generating static magnetic field;
 permanent magnet pieces for regulating the static magnetic field;
 holding members for holding the permanent magnet pieces;
 a tube for fixing the holding members, the tube being inserted into the means for generating static magnetic field;
 rollers provided on the holding members and for moving the tube;
 a tube support for fixing the tube to the means for generating static magnetic field;
 rail means for bringing the tube into or out from the means for generating static magnetic field; and
 rotator means for lifting up and rotating the tube at the rail means.

The above and other objects, effects, features and advantages of the present invention will become more apparent from the following description of embodiments thereof taken in conjunction with the accompanying drawings.

BRIEF DESCRIPTION OF THE DRAWINGS

FIG. 5 is a sectional view showing an example of securing field-regulating permanent magnet pieces to the hold plates;

FIG. 6 is a perspective view showing an example of concrete arrangement for field-regulating permanent magnet pieces;

FIGS. 14A, 14B and 14C are views explaining a tube introduction into and removal from a ring magnet, FIG. 14A being a side view, FIGS. 14B and 14C front views.

DETAILED DESCRIPTION OF PREFERRED EMBODIMENTS

Figure 1:
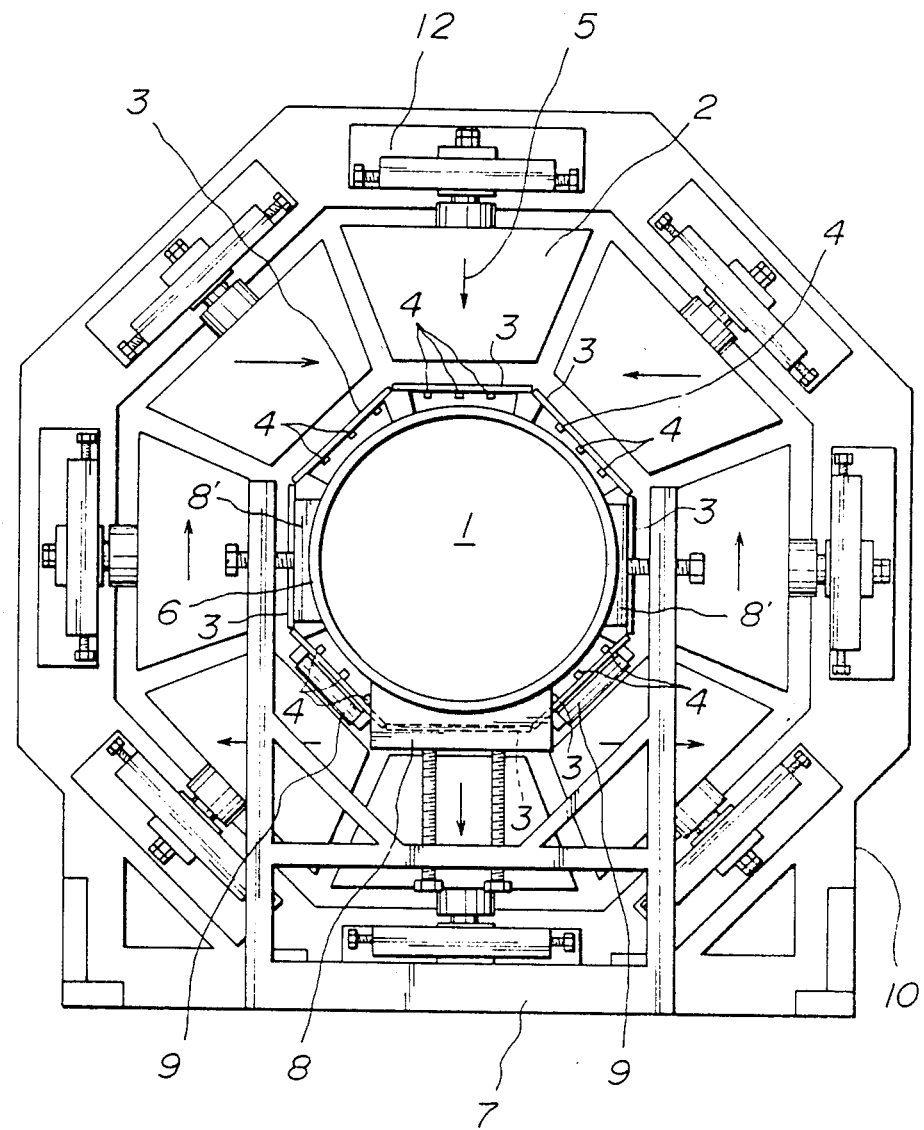
FIGS. 1 and 2 are front and perspective views respectively, showing an embodiment of the uniform magnetic field generator according to the present invention.

The present invention is explained in detail below, referring to the drawings.

Figure 2:
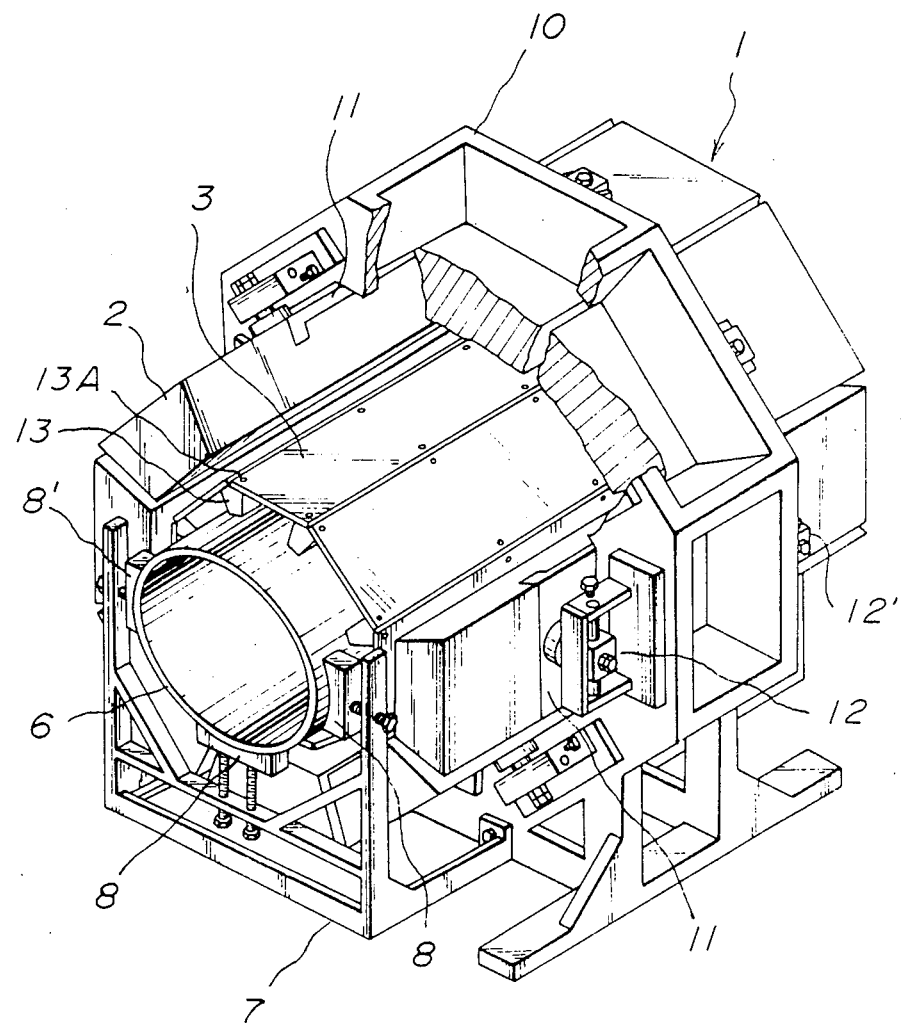
Figure 3A:
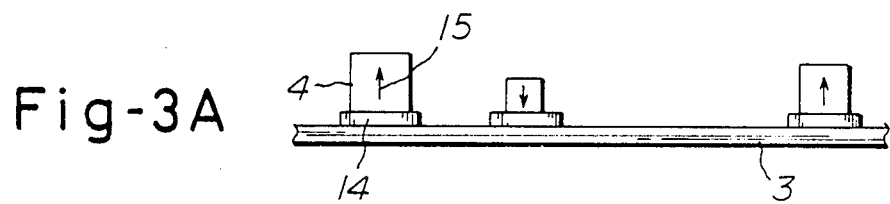
FIGS. 3A, 3B, 3C and 3D are partial front views showing an example of arrangement of field regulating permanent magnet pieces.
Figure 3B:
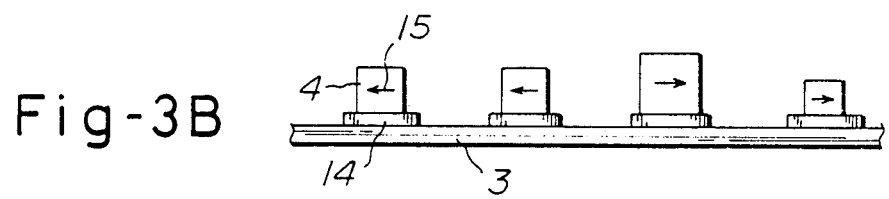
Figure 3C:
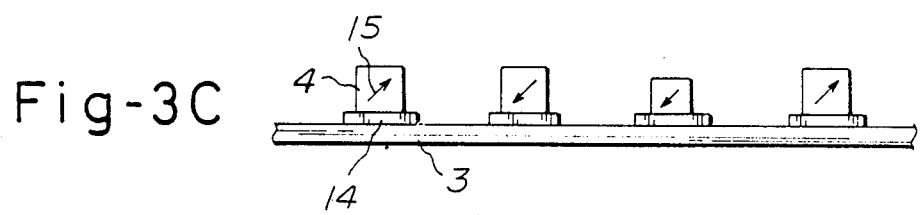
Figure 3D:
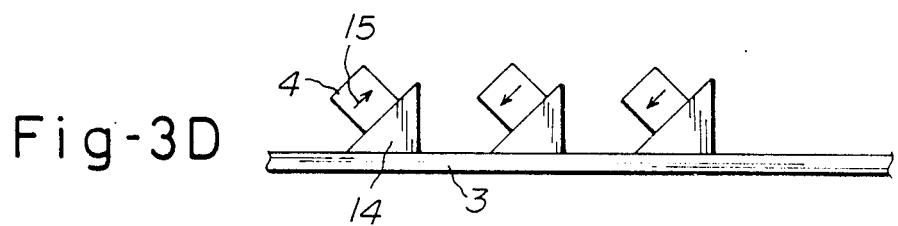

FIGS. 1 and 2 show an embodiment of the uniform magnetic field generator according to the present invention. In FIG. 2 the magnetic field generator and stand 10 are partially cut away. Here, eight permanent magnet blocks 2 are arranged annularly to constitute an annular magnet 1. The permanent magnet blocks 2 are of trapezoidal column shape, hence the annular magnet 1 forms a hollow trapezoidal tube. In this embodiment, the number of rings or annuli is one, and back plates 11 of non-magnetic material are connected to permanent magnet blocks 2. The eight permanent magnet blocks 2, secured to a stand 10 by an adjusting jig 12, 12', form the annular magnet 1.

Hold plates 3 of non-magnetic material are arranged annularly like the permanent magnet blocks 2 inside the annulus of annular magnet 1. These hold plates 3 are fitted with field-regulating permanent magnet pieces 4.

Tube 6 is arranged coaxially inside the annular magnet 1. Tube 6 is intended to be fitted with various types of coils (RF coil, gradient coil, etc.) for the formation of images when the present magnetic field generator is used for MRI. Tube 6 is fixed firmly to tube supports 7 provided at the front and rear of annular magnet 1 by tube fasteners 8, 8' of support 7. In this embodiment, the hold plates 3 are secured to the tube 6 by mounting seats 13 and bolts 13A. The tube 6 may be drawn out of the annular magnet 1 by removing the tube fasteners 8, 8' and utilizing rollers 9 mounted on the plates 3. This enables the permanent magnet pieces 4 to be mounted or replaced very easily.

The magnetizing direction of permanent magnet pieces 4 is set parallel to the magnetizing direction 5 of permanent magnet blocks 2 fitted with hold plates 3 holding the permanent magnet pieces 4.

However, the magnetizing direction of permanent magnet pieces 4 need not necessarily be parallel to the magnetizing direction 5; it may, of course, be set in a predetermined optional and desired direction.

In this embodiment, permanent magnet pieces 4 are arranged on the surface of hold plates 3 which are radially inside the annular magnet 1, but such pieces 4 may be arranged on the surface of hold plates 3 radially outside the annular magnet, or on the surface of permanent magnet blocks 2, or elsewhere. However, it is preferable to arrange them inside the annuli since that permits the size of permanent magnet pieces to be small and additionally provides a greater ability to correct high-dimensional harmonics.

The field-regulating permanent magnet pieces 4 will now be explained in detail.

FIGS. 3A, 3B, 3C and 3D are views showing various examples of arrangement for permanent magnet pieces 4, in all of which the pieces 4 are fitted to hold plates 3 through seats 14. The permanent magnet pieces 4 are of several sizes with their magnetizing directions 15 predetermined for each of the hold plates 3. The magnetizing directions 15 of the permanent magnet pieces are ordinarily parallel to the magnetizing direction of each permanent magnet block to which each hold plate corresponds. The magnetizing direction of each of the permanent magnet pieces on each hold plate 3 is same-/opposite. It is preferable that there are some permanent magnet pieces having an opposite magnetizing direction to that of other permanent magnet pieces, because the maximum size of the permanent magnet pieces can be reduced. The permanent magnet pieces 4 may be different from each other in size.

In another embodiment of the present invention, the size and mounting position of permanent magnet pieces 4 may be prefixed so as to use permanent magnet pieces 4 of different residual magnetization and alternatively the size of permanent magnet pieces 4 may be prefixed so as to increase the flexibility of their mounting position. The permanent magnet pieces 4 may be of several residual magnetization or may be of individually different residual magnetization.

The magnet materials available for these permanent magnet pieces 4 include Sm-Co base, Nd-Fe-B base, and other rare earth magnet material, ferrite magnet material, or their analogues. The same is true for the case of permanent magnet blocks 2.

Figure 4:
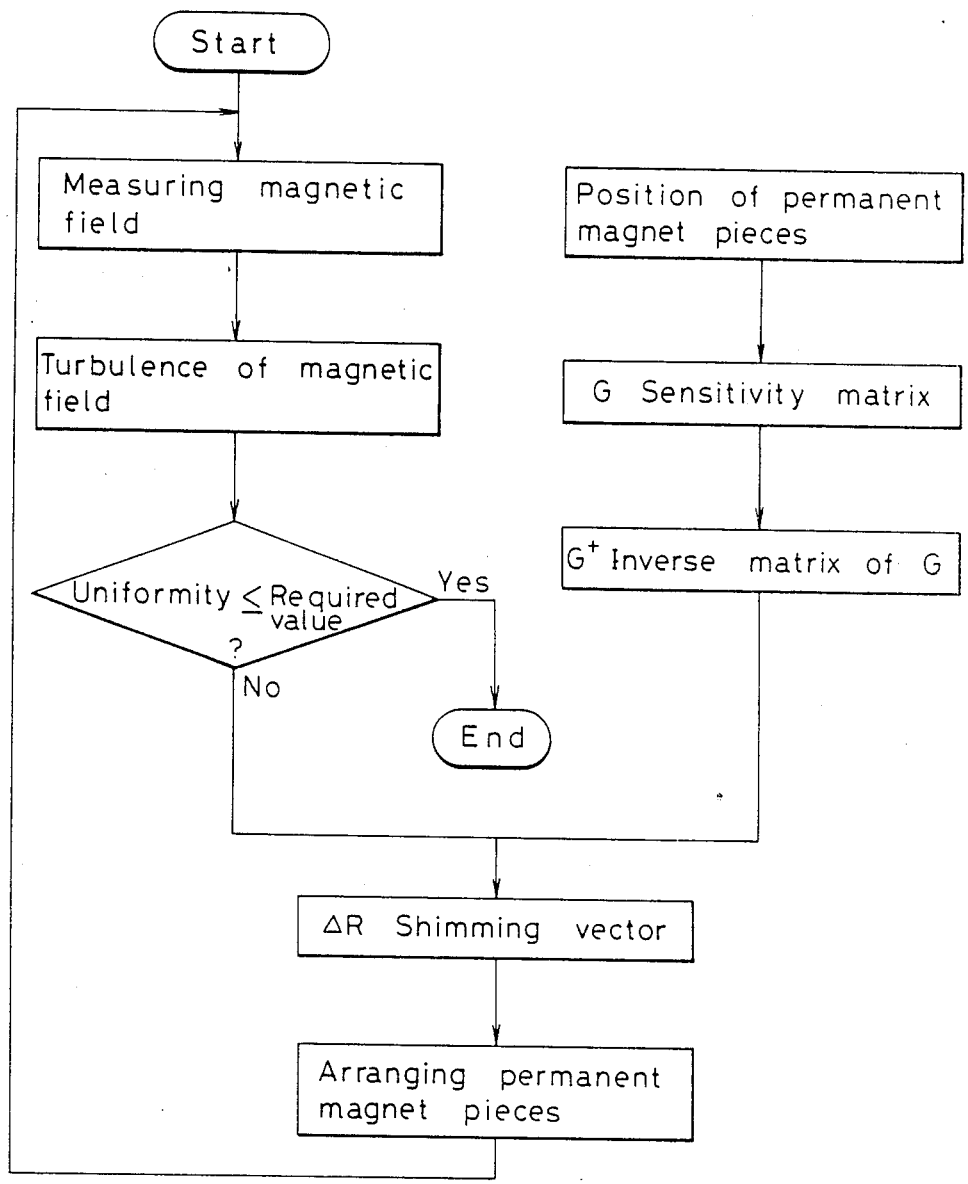
FIG. 4 is a flowchart showing a design example of field-regulating permanent magnet pieces.

FIG. 4 is a flowchart showing an example of procedure to determine the optimum arrangement of field regulating permanent magnet pieces 4. Several kinds of magnet pieces 4 are prepared which are equal in residual magnetization and different in size. The design information to size magnet pieces 4 should be fixed as calculated, for example, as follows.

First, the turbulence of the field is evaluated. The turbulence of a field of view (be a sphere here) is known to be fully assessable by looking into the turbulence of the surface of sphere. At numerous points (n points) on the surface, the magnetic field is measured ($H_1$, $H_2$, $H_3$ ... $H_n$) in the main magnetid field direction.

$C_p$, the turbulence of a certain point P, is defined by the following equation:

$$C_p = (H_p - H_0) \times 10^6 / H_0 \qquad (1)$$

where, $H_0$ is the field at the center of sphere. $C_p$, the turbulence of point P, is a value having plus and minus signs, and field turbulence is expressed by C at n number of points.

Next, regulation information must be obtained correspondingly to this field turbulence. Various positions (here predetermined positions on hold plates 3 where magnet pieces 4 may be mounted) are marked with a serial number, and the size of magnet pieces 4 is given as $\Delta R_i$ with respect to the i-th position. The magnetizing direction 15 of permanent magnet pieces 4 is determined relative to the permanent magnet blocks 2 to which the hold plates 3 are opposite, and assigned a plus or minus value.

Against a given turbulance, permanent magnet pieces 4 with various sizes are arranged and fixed at various positions. If the sizes of the permanent magnet pieces 4 are sequenced in this serial number order, they become vectors of ($\Delta R_1$, $\Delta R_2$, $\Delta R_3$, ... $\Delta R_m$). These vectors are called regulating vectors or shimming vectors.

The shimming vector, $\Delta R$, must be sought in order to carry out regulation of field. As a basic equation, the following is considered:

$$-C = G \cdot \Delta R \qquad (2)$$

$$\begin{bmatrix} C_1 \\ C_2 \\ C_n \end{bmatrix} = \begin{bmatrix} \partial C_1/\partial R_1 & \partial C_1/\partial R_2 & \partial C_1/\partial R_m \\ \partial C_2/\partial R_1 & \partial C_2/\partial R_2 & \\ \partial C_n/\partial R_1 & & \partial C_n/\partial R_m \end{bmatrix} \cdot \begin{bmatrix} \Delta R_1 \\ \Delta R_2 \\ \Delta R_n \\ \Delta R_m \end{bmatrix}$$

n: total number of coefficients of turbulence development m: total number of regulating mechanisms Here, C is a matrix vector of "field turbulence" obtained from field measurements, and G is a matrix of (n×m) indicating how the field of various measuring points changes relative to microchanges in the size of permanent magnet pieces 4 at various positions. G is called a sensitivity matrix.

$\Delta R$, an m-th matrix vector indicating the amount of parameter change, that is, the size of permanent magnet pieces 4 fixed at various positions, is found as a solution to Equation (2). This means that a new turbulence ($-C$) to nullify the field turbulence C is created.

Equation (2) is solved in the following manner. G, being a rectangular matrix of (n×m), can be converted with a set of orthogonal transformations, S and T, into the following forms (resolution into specific values):

$$G = S \cdot D \cdot T^+, \quad (D)_{ij} = d_{ij}\delta_{ij} \qquad (3)$$

Hence $$-C = SDT^+ \cdot \Delta R \qquad (4)$$

$$S^+(-C) = D \cdot T^+ \cdot \Delta R \qquad (5)$$

Writing this as $$-C' = D \cdot \Delta R' \qquad (6)$$

Equation (2) will have been transformed thus $$-\begin{bmatrix} C_1 \\ C_2 \\ C_n \end{bmatrix} = \begin{bmatrix} d_1 & & \\ & d_2 & \\ & & d_n \end{bmatrix} \cdot \begin{bmatrix} \Delta R'_1 \\ \Delta R'_2 \\ \Delta R'_n \\ \Delta R'_m \end{bmatrix} \qquad (7)$$

The various elements of vector $\Delta R$ are found as:

$$\Delta R'_j = (-C_j/d_j) \qquad (8)$$

If the matrix having $(1/d_i)$ as a diagonal element is given as $D^{-1}$, $$(D^{-1})_{ij} = (1/d_{ij}) \cdot S_{ij} \qquad$$

$$D^{-1}S^+ (-C) = T^+ \cdot \Delta R \qquad (9)$$

$$\Delta R = TD^{-1}S^+ (-C) = G^+ \cdot (-C) \qquad (10)$$

That is, the portion of $(TD^{-1}S^+)$ has become $G^+$, an inverse matrix of G. Once $G^+$ is thus found, $\Delta R$, a shimming vector which nullifies the turbulence of a certain field, is immediately found.

The concrete procedure is shown in according with FIG. 4.

First, the positions where magnet pieces 4 can be mounted are determined. These positions are taken, for example, to be lattice points defined at regular intervals on hold plates 3. Then, obtain by computing the information about field changes at the various measuring points on the surface of sphere at the time when a unit amount of magnet pieces have been arranged at the various positions, and this is prepared in the form of G matrix. Next, $G^+$, the generalized inverse matrix, is derived from the G matrix in the manner mentioned before. After assembly of the apparatus, an NMR probe is used to precisely measure the field at various measuring points (n) on the surface of sphere, and find the field turbulence C.

The difference between the greatest and least values of field uniformity, as derived from the results of these field measurements, is divided by the absolute magnetic field (mean value), and the result expressed in terms of ppm. If this value is not up to desired value (which, for example, is required to be 30 ppm or under in a unit having a center field of 3,000 gausses), Equation (17) is used to derive the size (shimming vector) $\Delta R$ of magnets arranged at various positions from $G^+$ and C.

Permanent magnet pieces 4 are prepared in accordance with the data on permanent magnet pieces 4, including position, size, magnetizing direction, and residual magnetization dependent on magnet materials used, which have been determined through the above-mentioned procedure. These pieces 4 are arranged and fixed on hold plates 3 via seats 14. They need to be fixed in place securely and firmly since their displacement after mounting detracts from the field uniformity. Regulation work is concluded by arranging and fixing the permanent magnet pieces 4. The above operation is repeated if further improvement of uniformity is desired. Errors arising from the variation of residual magnetization, movement of mounting position, etc., of permanent magnet pieces 4 can be also be approximated to zero by repeating regulation.

Permanent magnet pieces 4, connected onto seats 14 of non-magnetic material as shown in FIG. 5, are fixed to hold plates 3 of non-magnetic material securely by screws 16 also of non-magnetic material.

FIG. 6 shows an example of a preferred arrangement of field-regulating permanent magnet pieces 4 on a hold plate 3. Numerous open mounting holes 17 are located at predetermined positions on hold plates 3. Permanent magnet pieces 4 and seats 14 are fixed into desired mounting holes 17 on hold plates 3 by screws 16, then hold plates 3 are fixed to tube 6, matching them with permanent magnet blocks 2.

Next, the shape of permanent magnet blocks 2 in this embodiment will be explained in detail.

Figure 7:
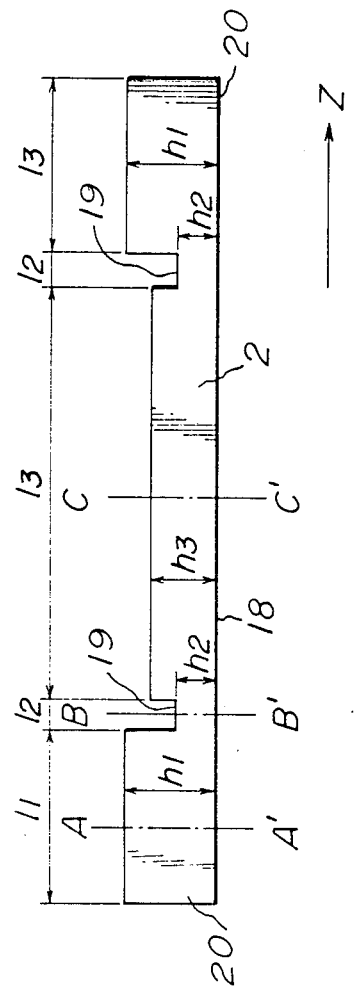
FIG. 7 is a side view showing an example of permanent magnet blocks constituting a permanent magnet unit used in the present invention.

FIG. 7 is a side view showing an example of permanent magnet block 2 in the magnetic filed generator of the present invention.

Figure 8A:
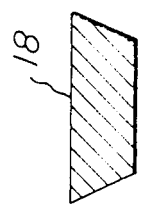
FIGS. 8A, 8B and 8C are sectional views through lines A—A', B—B' and C—C' respectively of the permanent magnet block shown in FIG. 7.

FIG. 8A is a sectional view of permanent magnet block 2 cut along line A—A' vertical to the annular axis (shown by an arrow Z) of FIG. 7.

Figure 8B:
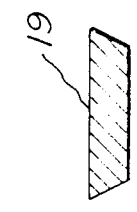

FIG. 8B is a sectional view of permanent magnet block 2 cut along line B—B' vertical to the annular axis of FIG. 7.

Figure 8C:
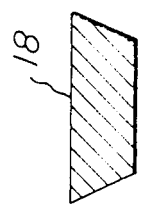

FIG. 8C is a sectional view of permanent magnet block 2 cut along line C—C' vertical to the annular axis of FIG. 7.

Here, permanent magnet block 2 is composed of main portion 18 having a sectional area corresponding to the required filed intensity, narrow portions 19 of small sectional area connected to both ends of this main portion 18, and tip portions 20 of greater sectional area than that of main portion 18.

In this permanent magnet block 2, the thickness $h_3$ and length $l_3$ of central main portion 18 are determined by the following equations correspondingly to required field intensity $H_0$:

$$h_3 = \frac{C_1 H_0 R}{Br(1 - C_1 (H_0/Br))} \qquad (11)$$

$$l_3 = \left( C_2 + C_3 \frac{Br}{H_0} \right) R \qquad (12)$$

where R is the required diameter of bore and Br the residual magnetization of the permanent magnet used. $C_1$ to $C_3$ are coefficients, and in order to obtain required field intensity, it is desirable to set $C_1 = 0.57$ to $0.62$, $C_2 = 0.81$ to $1.10$, and $C_3 = 0.029$ to $0.043$.

The thickness $h_1$ and $l_1$ of tip portion 20 at both ends of permanent magnet block 2 are determined by the following equations relative to the thickness $h_3$ and length $l_3$ of the main portion 18:

$$h_3 = C_4 h_3 (R + h_3) \qquad (13)$$

$$l_1 = -\frac{l_3}{2} + C_5 R \cdot B \qquad (14)$$

where B is the required diameter of spherical volume. $C_4$ and $C_5$ are coefficients, and in order to obtain required field uniformity, it is desirable to set $C_4 = 1.3 \times 10^{-3}$ to $1.8 \times 10^{-3}$ mm$^{-1}$, and $C_5 = 2.4 \times 10^{-3}$ to $3.4 \times 10^{-3}$.

The length $l_2$ of narrow portion 19 connected to both ends of main portion 18 is determined by the following equation relative to the length $l_3$ and thickness $h_3$ of main portion 18 and to the thickness $h_1$ of tip portion 20:

$$l_2 = C_6 l_3 \left( \frac{h_1}{h_1 + R} - \frac{h_3}{h_3 + R} \right) \qquad (15)$$

where $C_6$ is a coefficient, and in order to obtain required field uniformity it is desirable to set $C_6 = 0.9$ to $2.0$.

Also, the thickness $h_2$ of narrow portion 19 is determined by the following equation relative to the thickness of $h_3$ of main portion 18, the thickness of $h_1$ of tip portion 20, and the length $l_2$ of narrow portion 19:

$$h_2 = \frac{h_3 l_2 - C_7 (h_1 - h_3)}{l_2} \qquad (16)$$

where $C_7$ is a coefficient, and in order to obtain required field intensity, it is desirable to have $C_7 = 54$ to $72$ (mm).

Figure 9:
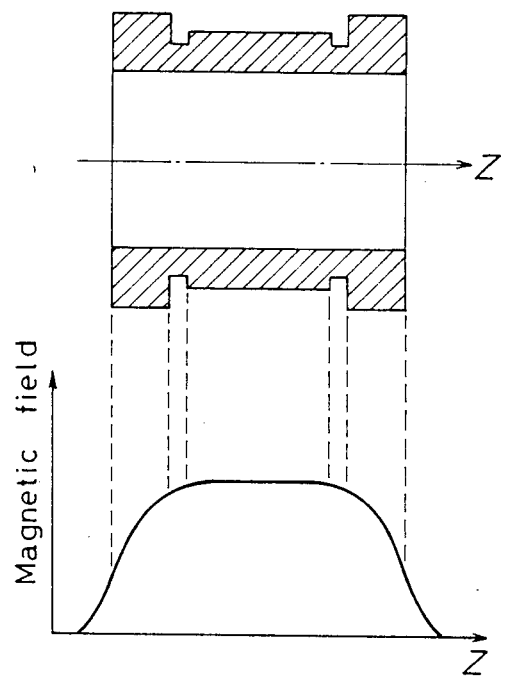
FIG. 9 is a field distribution view of the permanent magnet block shown in FIG. 7.

The above-mentioned sectional shape, that is, the area of section cut vertical to the annular axis is larger at both tip portions 20, right and left, than at the central main portion 18. A permanent magnet block 2 of such shape has narrow portions 19 with smaller sectional area than that of either the central main portion 18 or the tip portions 20 in order to obtain a wide and uniform field. FIG. 9 is a view corresponding to the side section of an annular magnet unit and showing magnetic field changes along the annular axial direction. It is apparent from FIG. 9 that uniformity has been improved by the provision of smaller sectional areas 19 between the center portion 18 and tip portions 20.

The permanent magnet block shown in FIG. 7 has a shape free from irregularities on the inside, but the present invention is not so limited. However, the permanent magnet block usually is magnetized while in the form of a smaller semi-block and then assembled, but the absence of irregularities on the surface forming the inside is preferable since that permits easy positioning or the like during assembly and assures highly accurate assembly.

Also, the permanent magnet block of FIG. 7 is of symmetrical shape, but this need not be a limiting factor if the aforementioned conditions are met.

The permanent magnet material usable for permanent magnet block 2 is an oriented anisotropical permanent magnet, and it is particularly desirable that it has a large Br (residual magnetization) value and a large coercive force.

Materials usable for this purpose, for example, are the rare earth-cobalt base magnet such as $SmCo_5$, $Sm_2Co_{17}$, or the like, the rare earth-iron base magnet, such as Nd-Fe-B, or the like, and ferrite magnet, or their analogues. Among these, magnets of high maximum energy product BHmax and low specific gravity are preferable. These types of magnets may include permanent magnets which are composed principally of 8 to 30 atomic percent Ln (Ln represents at least one of the Y-bearing rare earths), 2 to 28 atomic percent B, and 42 to 90 atomic percent Fe, and whose principal phase is tetragonal.

Figure 10:
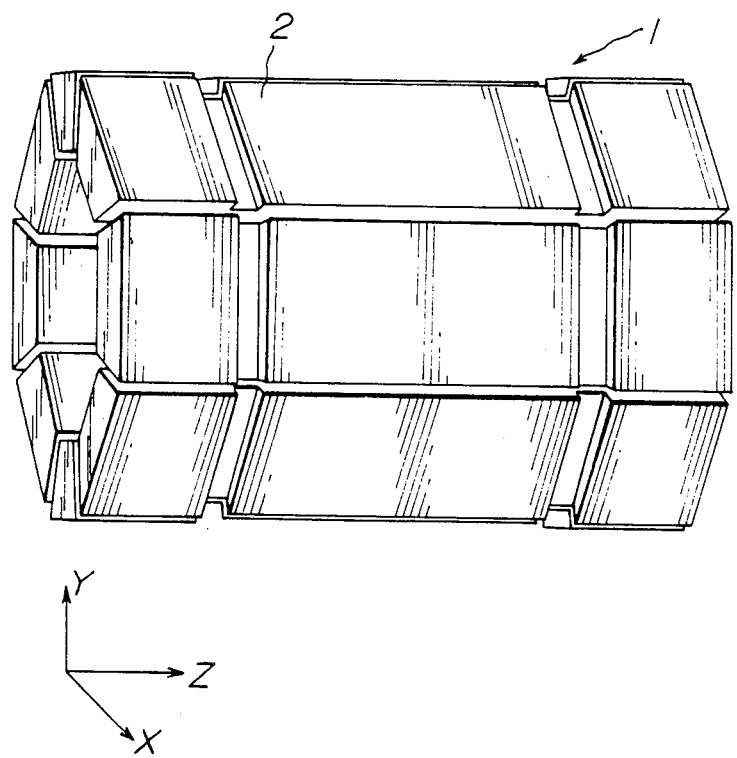
FIG. 10 is a perspective view showing an example of ring magnet in one embodiment of the present invention.

FIG. 10 is a perspective view of annular magnet 1 composed of permanent magnet blocks 2 shown in FIG. 7. This annular magnet 1 is formed by an annular arrangement of permanent magnet blocks 2.

In FIG. 10, the permanent magnet unit based on one annular magnet 1 consists of eight anisotropic permanent magnet blocks 2, but annular magnet 1 may also be formed by more or fewer blocks 2.

According to the inventors' study results, the greater the number of permanent magnet blocks 2, the lower the amount of magnet necessary to obtain a concentric field. Also, when the number of blocks 2 forming the annular magnet 1 is even, a uniform field is easy to obtain since annular magnet 1 is highly symmetric.

In FIG. 10, moreover, annular magnet 1 is of regular octagonal shape, but the magnet need not be a regular polygon provided the opposed blocks are substantially equal in shape. It may alternatively be horizontally long or vertically long.

Figure 11:
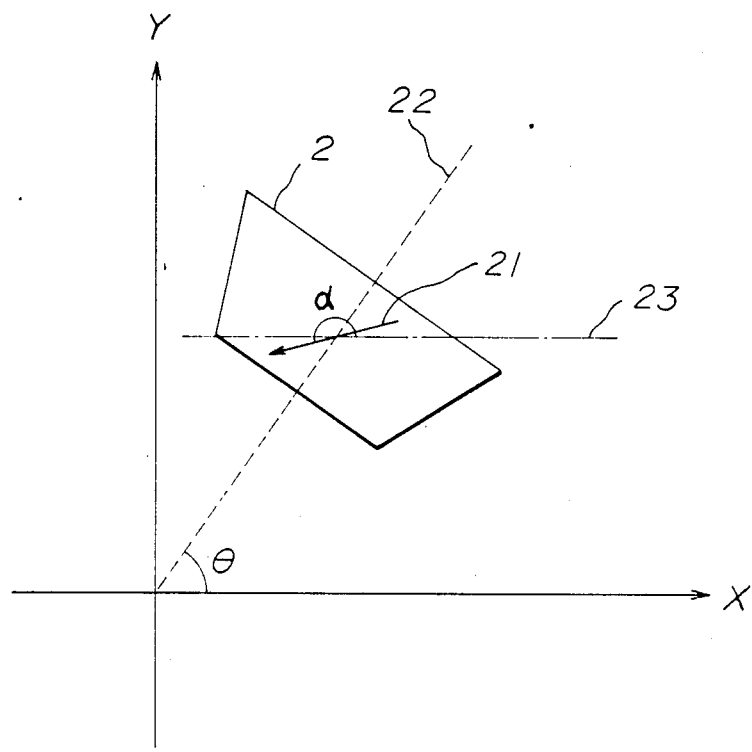
FIG. 11 is a view showing the magnetizing direction of permanent magnet blocks.

FIG. 11 is a view showing the magnetizing direction 21 of permanent magnet block 2. If the axial direction of annular magnet 1 vertical to the paper surface is given as Z, and the plane vertical to the axis of annular magnet 1 as XY plane, then the permanent magnet blocks 2 forming the annular magnet 1 should desirably be ones arranged annularly so that the orientation of the easy axis of magnetization may become an angle determined in the following equation:

$$\alpha = 2\theta + \pi/2 \qquad (17)$$

where $\theta$ is the angle between the radially symmetrical line 22 of permanent magnet block 2 and the X axis, and o the angle formed by the easy axis of magnetization (magnetizing direction) 21 of block 2 and line 23 parallel to the X axis.

In the present invention, furthermore, means of regulation by permanent magnet pieces 4 may be used in combination with other means of adjustment, for example, with movement of permanent magnet blocks 2 constituting the annular magnet 1, or with shim coils.

The embodiment shown in FIG. 1 may be equipped with means of adjustment by movement of permanent magnet blocks 2.

Connected to permanent magnet blocks 2 are back plates 11, of non-magnetic material, on the face corresponding to the annular outside when the blocks 2 are connected to form the annular magnet. On the other hand, adjusting jigs 12 and 12' for moving permanent magnet blocks 2 and adjusting the field, are fixed to annular stand 10 onto which annular magnet 1 can be loose fitted. These adjusting jigs 12 and 12' are fitted to back plates 11 to support each of permanent magnet blocks 2 movably. Adjusting jigs 12 and 12' are designed to move the position of each permanent magnet block 2 after assembly of the permanent magnet unit and improve field uniformity. These adjusting jigs 12 and 12' and the stand 10 are composed of non-magnetic material.

Figure 12:
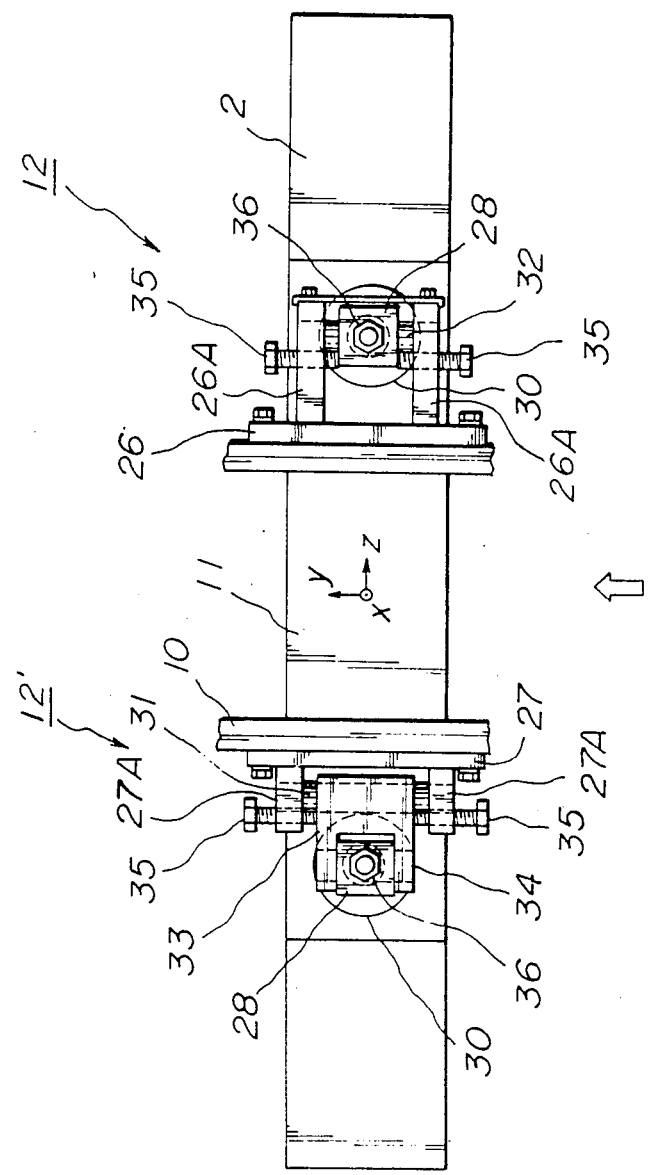
FIGS. 12, and 13 are a plan and side view respectively, showing an example of installing the permanent magnet block shown in FIG. 2.
Figure 13:
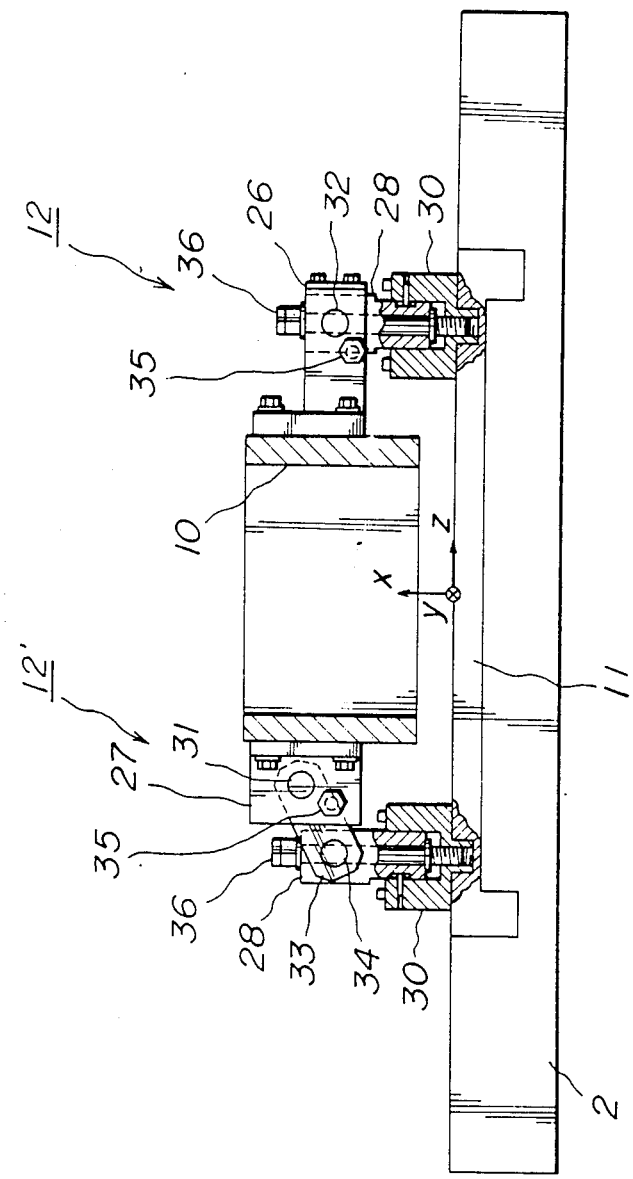

Next, preferred examples of such adjusting jigs 12 and 12' are detailed in FIGS. 12 and 13.

FIG. 12 is a plan view of the permanent magnet unit of FIG. 2 and shows an example of fitting each of permanent magnet blocks 2 to stand 10. FIG. 13 is a side view of the permanent magnet block shown in FIG. 12 as viewed from the side indicated by an arrow in FIG. 12.

Permanent magnet block 2 has back plate 11 connected to it as mentioned above, and the permanent magnet block 2 is fixed to stand 10 in a longitudinal direction at two points, right and left, by adjusting jigs 12 and 12'. Adjusting jigs 12 and 12' are designed to permit adjustment of the position and posture of the permanent magnet blocks 2, and they are arranged in order to permit their adjustment in the X and Y directions as well as rotation around the X and Y axes.

More particularly, in FIGS. 12 and 13, guide members 30 hold slide shafts 28 so that they are rotatable and movable up and down. The guide members 30 are fixed to back plates 11 located almost symmetrically to the center face of stand 10. Bearing members 26 and 27 are fixed on the side of stand 10. These bearing members 26 and 27 support rotating shafts 32 and 31 respectively. In addition, in FIGS. 12 and 13, swing arm 33 is supported rotatably on the rotating shaft 31 of jig 12' and, the end of arm 33 is connected to slide shaft 28 via pin 34. As a result, some play will be provided between swing arm 33 and pin 34.

The rotating shaft 32 of jig 12 is connected directly to slide shaft 28. Machine bolts 35 are screwed into threaded holes provided respectively on the arms 26A and 27A of bearing members 26 and 27. They are screwed into place inward respectively past the opposed arms. In FIGS. 12 and 13, jig 12' on the left and jig 12 on the right directly support swing arm 33 and slide shaft 28 respectively. Push-pull bolts 36 are fitted into slide shafts 28. Screwing in the bolts 36 or screwing them back enables slide shafts 28, themselves to be moved up or down.

In adjusting jigs 12 and 12' arranged thusly, to move them in the X direction, for example, the two push-pull bolts 26 are turned the same amount, right and left, in the same direction. To move the jigs 12 and 12' in the Y direction, of the four machine bolts 35 provided on the right and left bearing members 26 and 27 as shown in FIG. 12, the two machine bolts 35 on the desired side (in the figure, either upper or lower bolts) can be loosened correspondingly to the amount of movement and the machine bolts 35 on the opposite side likewise tightened up.

Also, rotation around the X axis can be effected by moving the machine bolt 35 to the right and left in opposite directions and by this operation slide shafts 28 may be rotated within guide members 30.

Rotation around the Y axis can be effected by moving the push-pull bolts 36, used during movement in the X direction, in opposite directions right and left. Rotation at this time involves rotating shafts 31 and 32 as well as pin 34. In addition, changes in the distance between right and left adjusting jigs 12' and 12 arising from Y axis rotation are absorbed by swing arms 33.

Figure 14C:
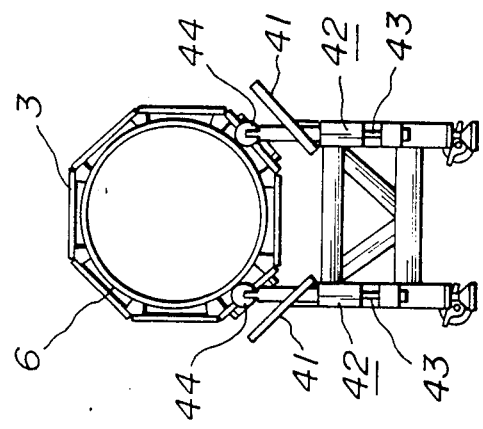
Figure 14B:
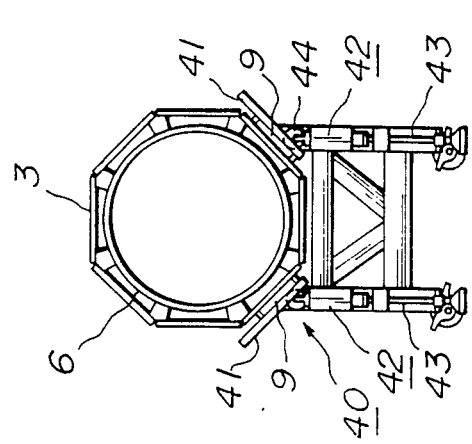

Movement of tube 6 into and out of annular magnet 1 will now be described with reference to FIGS. 14A, 14B and 14C. FIG. 14A is a side view of tube car 40 used for introduction and removal of tube 6 and of the embodiment of magnetic field generator shown in FIG. 1, with partial cutoffs shown of permanent block 2, stand 10, tube support 7, and tube car 40. FIGS. 14B and 14C are front views taken from the side of tube car 40. When the tube 6 is taken out of annular magnet 1, tube fasteners 8 and 8' are first removed, and tube 6 is lowered on permanent magnet blocks 2. At this time, tube 6 is in contact with permanent magnet blocks 2 via rollers 9 mounted on hold plates 3.

The tube car 40 may then be moved to the position shown in FIG. 14A. The face of racks 41 of tube car 40 is in line with the face of permanent magnet blocks 2 with which the rollers 9 are in contact. Tube 6 can then be moved smoothly onto tube car 40 by rollers 9. This operation is reversed when putting tube 6 into annular ring 1. Tube 6 after it has been moved onto tube car 40 is shown in FIG. 14B. Tube 6 may be made rotatable by four tube rotating jigs 42 attached to tube car 40. That is, each roller 44 may be raised by rotating the bolt 43 of each tube rotating jig 42, and thus tube 6 supported by these rollers 44 is also raised. Consequently, tube 6 may be rotated freely on car 40. This makes it possible to fit hold plates 3 to tube 6 or remove them therefrom very easily. As a result, it is easy to fit or remove permanent magnet pieces 4.

Next, the working and assembly procedures for various parts on the magnetic field generator according to the present invention will be described.

(1) Bricks

Permanent magnet blocks 2 are assembled from small anisotropic permanent magnet bricks, for example, about 20 mm × 30 mm × 50 mm.

(2) Forming Into Semi-blocks

Semi-blocks are made by splitting a permanent magnet block into several parts, and their size is limited by magnetizer capacity, ease of handling, etc. They are made to be, for example, 200 mm × 200 mm × 200 mm in size. These unmagnetized anisotropic permanent magnet bricks are bonded together with easy axes of magnetization aligned, or they are precut into required shapes before bonding together. Following this, they are made into semi-blocks of required shape and magnetizing direction by repeating the cut and bond cycle. Moreover, these semi-blocks are completely ground and finished to required dimensions and tolerances.

(3) Magnetizing

The semi-blocks constructed in the above manner are magnetized according to the magnetizing direction with a required magnetic field.

(4) Forming Into Blocks

The magnetized semi-blocks are bonded to close tolerances one after another by the use of jigs until permanent magnet blocks such as shown in FIG. 2 are obtained.

(5) Forming Into Unit (Annulus)

A plurality of permanent magnet blocks 2 thus constructed are mounted in sequence on stand 10 by the use of jigs 12 and 12' to complete a permanent magnet unit.

(6) Initial Setting

The position of permanent magnet blocks 2 is adjusted by the use of adjusting jigs 12 and 12' and set to design values.

Next, magnetic field regulation procedure is explained.

(1) Field Measurement

An NMR probe is used to measure the magnetic field with respect to numerous points (for example, 91 points) on the surface of a field of view (sphere) of required size at the center of the permanent magnet unit.

(2) Evaluation of Uniformity

The difference between the greatest and least values of magnetic field uniformity, as derived from the above field measurement results, is divided by the absolute field (means value) and expressed in terms of ppm.

(3) Regulation

As mentioned previously, the magnetic field turbulence is evaluated through the field measurement of paragraph (1), a regulating vector is worked out by computation, the size and layout of permanent magnet pieces 4 are determined, and they are then mounted and fixed. Prior to this regulation by permanent magnet pieces 4, however, adjustment by the movement of permanent magnet blocks 2 is carried out as the occasion demands. The procedure is basically the same as that for regulation by permanent magnet pieces 4. That is, with the amount of movement of each permanent magnet block 2 as a parameter, a regulating vector which will improve uniformity is worked out by computation. Using the adjusting jigs 12 and 12', each permanent magnet block is moved to specified position.

As an example of a magnetic field generator, an annular magnet type generator composed of anistropic magnets arranged annularly has been explained in detail But the present invention is not limited to above-mentioned example.

The present invention can be applied to other permanent magnet types, for example, a permanent magnet with pole pieces and a magnetic yoke, generators or electromagnet type magnetic field generators. For example, the present invention can be applied to an electromagnet type generator utilizing double Helmholtz coils which are generally used for generating a static magnetic field in electromagnets. Double Helmholtz coils are composed of symmetrically arranged four air-coils, and these coils are fixed to a stand. Permanent magnet pieces are arranged and fixed on a hold plate and this hold plate is fixed to a tube, the tube is then inserted into coils. For split coils, such as double Helmholtz coils, the tube may be arranged in coaxial relation to the axis of coils or may be arranged between coils perpendicular to the axis of coils. The tube may be supported by a tube support in the same manner as the annular magnet type permanent magnet. A coil for an electromagnet may be a super-conducting coil.

As has been stated above, the uniform magnetic field generator of the present invention provides for the arrangement of permanent magnet pieces, so even extremely small permanent magnet pieces are fully capable of uniformity improvement. Also, the magnetic field distribution formed in space by permanent magnet pieces can be precisely calculated in a short time for each permanent magnet piece, and thus an optimum arrangement for uniformity improvement is easily obtained. Therefore, according to the present invention, sufficient adjustment can be provided not only for magnetic field non-uniformity due to errors in the shape or position of permanent magnet block or coils, but also for errors including, for example, high-order harmonics arising from the variation of magnetic characteristics in the magnet bricks which constitute the permanent magnet blocks. Therefore, an extremely uniform and wide magnetic field space is obtained. Moreover, this generator has another major advantage in that since it permits easy mounting and fixing of permanent magnet pieces, regulation is available accurately and quickly. This magnetic field generator is preferable for use in such equipment as MRI.

What is claimed is:

1. A uniform magnetic field generator comprising:
 means for generating a static magnetic field; and
 means for regulating a uniformity of said static magnetic field;
 said generating means being an annular permanent magnet comprising a plurality of permanent magnet blocks arranged annularly;
 said regulating means comprising a plurality of adjustably positioned permanent magnet pieces, said plurality of adjustably positioned permanent magnet pieces positionable relative to said generating means in said static magnetic field for regulating the uniformity of said magnetic field, said regulating means further comprising a non-magnetic hold plate for holding said plurality of adustably positioned permanent magnetic pieces in said static magnetic field.

2. A uniform magnetic field generator as claimed in claim 1, wherein the residual magnetization of each of said permanent magnet pieces is substantially identical to each other.

3. A uniform magnetic field generator as claimed in claim 2, wherein said adjustably positioned permanent magnet pieces are of different sizes.

4. A uniform magnetic field generator as claimed in claim 1, wherein the size of each of said permanent magnet pieces is substantially identical to each other.

5. A uniform magnetic field generator as claimed in claim 4, wherein the residual magnetization of said adjustably positioned permanent magnet pieces is different.

6. A uniform magnetic field generator as claimed in claim 1, wherein said adjustably positioned permanent magnet pieces are fitted to and removed from the non-magnetic hold plate.

7. A uniform magnetic field generator as claimed in claim 1, wherein said permanent magnet blocks are continuous bodies and have at least three different sectional areas in a section vertical to the axial direction of said annulus within the same block.

8. A uniform magnetic field generator as claimed in claim 7, wherein said plurality of permanent magnet blocks are of a face-symmetrical shape.

9. A uniform magnetic field generator comprising:
means for generating a static magnetic field;
at least one permanent magnet piece for regulating the uniformity of said static magnetic field; and
means for holding said at least one permanent magnet piece next to said means for generating said static magnetic field;
wherein said means for generating a static magnetic field is a permanent magnet, said permanent magnet is an annular magnet comprising a plurality of permanent magnet blocks arranged annularly, said magnet permanent magnet blocks are continuous bodies and have at least three different sectional areas in a section vertical to the axial direction of said annulus within the same block, said permanent magnet blocks are of a face-symmetrical shape, and wherein said selection of said permanent magnet blocks cut vertical to the axis of said annular magnet is greater at the two end portions that at the center main portion, and between said center main portion and said two end portions, said block has narrow portions of less sectional area than that of said center main portion and said two end portions.

10. A uniform magnetic field generator as claimed in claim 9, wherein each of said permanent magnet blocks is movable in two axial orthogonal directions crossing the axial direction of said annular magnet, and said permanent magnet blocks are rotatable around said two axial directions.

11. A uniform magnetic field generator comprising:
means for generating a static magnetic field;
adjustably positioned permanent magnet pieces, said adjustably positioned permanent magnet pieces positionable relative to said static field generating means for regulating the uniformity of said static magnetic field;
holding members for holding said adjustably positioned permanent magnet pieces at desired positions;
a tube for fixing said holding members; and
means for moving said tube and fixed holding members into and out of said static magnetic field generating means.

12. The uniform magnetic field generator according to claim 11, wherein said moving means comprises rollers provided on said holding members, and rail means for supporting said tube.

13. The uniform magnetic field generator according to claim 12, further comprising a tube support for fixing said tube to said static field generating means.

14. The uniform magnetic field generator according to claim 13, further comprising rotator means for lifting up and rotating said tube at said rail means.

15. A uniform magnetic field generator as claimed in claim 1, wherein said plurality of adjustably positioned permanent magnetic pieces are manually adjustable.

16. A uniform magnetic field generator as claimed in claim 1, wherein said regulating means further comprises a non-magnetic seat, said plurality of permanent magnetic pieces being fixed to said holding plate via said seat.

17. A uniform magnetic field generator as claimed in claim 16, further comprising a plurality of non-magnetic screws, and wherein said hold plate includes a plurality of first open mounting holes, and wherein said non-magnetic seat includes a second open mounting hole, said non-magnetic seat being fixed to said hold plate by inserting said non-magnetic screw through one of said plurality of first open mounting holes of said non-magnetic hold plate and through the second open mounting hole of said non-magnetic seat.

* * * * *